(12) United States Patent
Lee

(10) Patent No.: US 9,547,023 B2
(45) Date of Patent: Jan. 17, 2017

(54) TEST PROBE FOR TEST AND FABRICATION METHOD THEREOF

(75) Inventor: Jae Hak Lee, Gyeonggi-do (KR)

(73) Assignee: ISC CO., LTD., Seongnam-si, Gyeonggi-do (KR)

( * ) Notice: Subject to any disclaimer, the term of this patent is extended or adjusted under 35 U.S.C. 154(b) by 961 days.

(21) Appl. No.: 13/807,949

(22) PCT Filed: Jul. 1, 2011

(86) PCT No.: PCT/KR2011/004826
§ 371 (c)(1),
(2), (4) Date: Jan. 2, 2013

(87) PCT Pub. No.: WO2012/002763
PCT Pub. Date: Jan. 5, 2012

(65) Prior Publication Data
US 2013/0106457 A1    May 2, 2013

(30) Foreign Application Priority Data

Jul. 2, 2010 (KR) .................. 10-2010-0063874
Dec. 10, 2010 (KR) .................. 10-2010-0126359

(51) Int. Cl.
*G01R 1/067* (2006.01)
*G01R 3/00* (2006.01)

(52) U.S. Cl.
CPC .......... *G01R 1/067* (2013.01); *G01R 1/06738* (2013.01); *G01R 3/00* (2013.01); *G01R 1/06722* (2013.01); *Y10T 29/49117* (2015.01)

(58) Field of Classification Search
CPC .............. G01R 1/0416; G01R 1/06722; G01R 1/06777; H01R 13/2421; H01R 2201/20; H01R 12/714; H01R 12/73
See application file for complete search history.

(56) References Cited

U.S. PATENT DOCUMENTS

| 6,462,567 B1* | 10/2002 | Vinther | G01R 1/06722 324/754.14 |
| 2004/0113640 A1* | 6/2004 | Cooper | G01R 3/00 324/750.25 |
| 2007/0222466 A1 | 9/2007 | Heinemann et al. | |

FOREIGN PATENT DOCUMENTS

| JP | 2004-340661 A | 12/2004 |
| JP | 2005-249693 A | 9/2005 |

(Continued)

OTHER PUBLICATIONS

KIPO NOA dated May 19, 2011; Application No. 10-2010-0063874.
International Search Report: mailed Jan. 16, 2012; PCT/KR2011/004826.

*Primary Examiner* — Daniel Miller
(74) *Attorney, Agent, or Firm* — Ladas & Parry LLP

(57) ABSTRACT

A method of fabricating a test probe includes a first conductive providing operation in which a first conductive member formed of a conductive metal material is provided, the first conductive member including a probe portion that has a probe shape and is formed in an upper portion of the first conductive member by a micro-electromechanical systems (MEMS) process, a second conductive member providing operation in which a second conductive member formed of a conductive metal material is provided, the second conductive member having an insertion portion formed in an upper portion of the second conductive member for inserting the first conductive member to be coupled to the insertion portion, an insertion operation in which the first conductive member is inserted into the insertion portion of the second conductive member, and a fixing and coupling operation in which the first conducive member is fixedly coupled to the second conductive member by deforming a part of the second conductive member.

17 Claims, 9 Drawing Sheets

(56) References Cited

FOREIGN PATENT DOCUMENTS

| JP | 2005-337994 A | 12/2005 |
|---|---|---|
| JP | 2006-184055 A | 7/2006 |
| KR | 1020090093738 A | 9/2009 |

\* cited by examiner

TEST PROBE FOR TEST AND FABRICATION METHOD THEREOF

TECHNICAL FIELD

The present invention relates to a test probe and a fabrication method thereof, and more particularly, to a test probe having a probe portion that may be firmly attached in a simplified process and exhibits superior durability and replaceability, and a method of fabricating the test probe.

BACKGROUND ART

In general, to test electrical properties of a semiconductor device, a stable electrical connection between the semiconductor device and test equipment (not shown) is essential. A test socket is typically used to connect between a semiconductor and test equipment.

The test socket enables bidirectional exchange of electric signals between a terminal of a semiconductor device that is a device to be tested and a pad of the test equipment. To this end, a test probe such as a pogo pin is used as a contact device in the test socket. The pogo pin with a spring inside may facilitate connection between the semi-conductor device and the test equipment and buffer mechanical shocks generated when the semiconductor device and the test equipment are connected to each other. Accordingly, the pogo pin has been widely used for most test sockets.

FIG. 1 is a cross-sectional view of a test probe used for a test socket, according to a related art. Referring to FIG. 1, a test probe according to a related art includes a barrel 20, an upper pin member 10 having a test probe portion 12 and capable of slidably moving in the barrel 20, a lower pin member 40 formed in a lower end portion of the barrel 20. A compression coil spring 30 is accommodated in the barrel 20 so as to elastically support the upper pin member 10.

When a device to be tested (not shown), such as a microchip, is tested in the above structure, a microchip is placed on top of a test socket and a pressing device (not shown) presses downwardly the microchip so that the microchip contacts a tip of the test probe portion 12 of the upper pin member 10.

DISCLOSURE OF INVENTION

Technical Problem

The test socket according to a related art has the following demerits.

First, since the terminal of the device to be tested that is contacted by a test probe becomes smaller, the test probe portion 12 of the upper pin member 10 needs to be smaller accordingly. However, since in the related art the test probe portion 12 is processed, mainly by mechanical processing, there is a limit in miniaturization.

Also, considering that the size of the terminal gradually decreases, multiple points contact is preferable for more efficient electric contact to the terminal. In the related art, however, since there is a limit in the size of the terminal, it is difficult to realize the multiple points contact.

Furthermore, the test probe portion is processed to be incorporated in the pin member. In this case, when the test probe portion is abraded, it is inconvenient to process the whole pin member.

Solution to Problem

To solve the above and/or other problems, the present invention provides a test probe that easily embodies a fine probe, is easily fabricated, and exhibits superior durability and replaceability, and a method of fabricating the test probe.

According to an aspect of the present invention, a method of fabricating a test probe includes a first conductive member providing operation in which a first conductive member formed of a conductive metal material is provided, the first conductive member including a probe portion that has a probe shape and is formed in an upper portion of the first conductive member by a micro-electromechanical systems (MEMS) process, a second conductive member providing operation in which a second conductive member formed of a conductive metal material is provided, the second conductive member having an insertion portion formed in an upper portion of the second conductive member for inserting the first conductive member to be coupled to the insertion portion, an insertion operation in which the first conductive member is inserted into the insertion portion of the second conductive member, and a fixing and coupling operation in which the first conducive member is fixedly coupled to the second conductive member by deforming a part of the second conductive member.

The first conductive member may have a shape in which a cross section of an upper portion is smaller than that of a lower portion, the insertion portion of the second conductive member may be an concave groove having an inner diameter corresponding to a lower end of the first conductive member, and in the fixing and coupling operation, by pressing the upper end of the insertion portion to be deformed inwardly, an inner surface of an upper end of the insertion portion may closely contact an outer circumferential surface of the first conductive member to allow the first conductive member to be fixedly coupled to the second conductive member.

The first conductive member may include an upper conductive portion having a circular plate shape and having the probe portion on an upper end surface, and a lower conductive portion integrally formed at a lower side of the upper conductive portion and having a circular plate shape, the lower conductive portion having a diameter greater than that of the upper conductive portion, the insertion portion of the second conductive member may be a groove having a circular cross-section having an inner diameter corresponding to the lower conductive portion, and in the fixing and coupling operation, by pressing an outer circumferential surface of the insertion portion corresponding to the upper conductive member toward the upper conductive portion, an outer circumferential surface of the upper conductive portion and an inner circumferential surface of the insertion portion may closely contact each other to allow the first conductive member to be fixedly coupled to the second conductive member.

The probe portion may protrude outside the upper conductive portion, and the probe portion may have a size large enough to be accommodated on an upper end of the insertion portion when the first conductive member is accommodated in the insertion portion of the second conductive member.

The above method may further include providing a forming mold in which a pressing groove is formed, an inner diameter of a lower end of the pressing groove being larger then an outer diameter of the insertion portion and gradually decreasing toward an upper end of the pressing groove to be smaller than the outer diameter of the insertion portion, wherein, in the fixing and coupling operation, by inserting the second conductive member into the pressing groove, the insertion portion may be caulking deformed inwardly by the inner surface of the pressing groove.

In the insertion operation, the first conductive member may be press-fit to the second conductive member.

The first conductive member may have a ring shape and have a connection hole vertically formed at a center of the first conductive member, the second conductive member may include an accommodation surface on which a lower surface of the first conductive member is accommodated, and a protruding portion protruding from the accommodation surface, having a shape corresponding to the connection hole, and protruding upwardly higher than the first conductive member, and in the fixing and coupling operation, by deforming the protruding portion by applying pressure to the protruding portion using a punch, the protruding portion may closely contact an upper end surface of the first conductive member to fix and couple the first conductive member to the second conductive member.

According to another aspect of the present invention, a test probe is fabricated by the above method.

According to another aspect of the present invention, a test probe includes a first conductive member formed of a conductive metal material and including a probe portion that has a probe shape and is formed in an upper portion of the first conductive member by a micro-electromechanical systems (MEMS) process, the first conductive member having a shape in which a cross section of an upper portion is smaller than that of a lower portion, and a second conductive member having an insertion portion for inserting the first conductive member to be coupled to the insertion portion, wherein the insertion portion of the second conductive member has a concave groove shape having an inner diameter corresponding to a lower end of the first conductive member, and an upper end of the insertion portion is deformed inwardly to allow an inner circumferential surface of an upper end of the insertion portion to closely contact an outer circumferential surface of the first conductive member.

According to another aspect of the present invention, a test probe includes a first conductive member formed of a conductive metal material and including an upper conductive portion having a circular plate shape and having a probe portion on an upper end surface, and a lower conductive portion integrally formed at a lower side of the upper conductive portion and having a circular plate shape, the lower conductive portion having a diameter greater than that of the upper conductive portion, and a second conductive member having an insertion portion formed in an upper portion of the second conductive member, the insertion portion having a groove shape having a circular cross section and having an inner diameter corresponding to the lower conductive portion to allow the first conductive member to be inserted in and coupled to the insertion portion, and the first conductive member is inserted into the insertion portion, and an upper end of the insertion portion is deformed inwardly to allow an inner circumferential surface of an upper end of the insertion portion to closely contact an outer circumferential surface of the first conductive member.

According to another aspect of the present invention, a test probe includes a first conductive member formed of a conductive metal material and including an upper conductive portion having a circular plate shape and having a probe portion on an upper end surface, and a lower conductive portion integrally formed at a lower side of the upper conductive portion and having a circular plate shape, the lower conductive portion having a diameter greater than that of the upper conductive portion, and a second conductive member having an insertion portion formed in an upper portion of the second conductive member, the insertion portion having a groove shape having a circular cross section and having an inner diameter corresponding to the lower conductive portion to allow the first conductive member to be inserted in and coupled to the insertion portion, and the first conductive member is inserted into the insertion portion, and an upper end of the insertion portion is deformed inwardly to allow an inner circumferential surface of an upper end of the insertion portion to closely contact an outer circumferential surface of the first conductive member.

The probe portion may protrude outside the upper conductive portion and have a size large enough to be accommodated on an upper end of the insertion portion when the first conductive member is accommodated in the insertion portion of the second conductive member.

According to another aspect of the present invention, a test probe includes a first conductive member formed of a conductive metal material and having a ring shape and a connection hole vertically formed at a center of the first conductive member, the first conductive member including a probe portion that has a probe shape and is formed in an upper portion of the first conductive member by a micro-electromechanical systems (MEMS) process, and a second conductive member including an accommodation surface on which a lower surface of the first conductive member is accommodated, and a protruding portion protruding from the accommodation surface, having a shape corresponding to the connection hole, and protruding upwardly higher than the first conductive member, wherein the protruding portion of the second conductive member is pressed to be horizontally extended so that an upper surface of the first conductive member is fixed by a lower surface of the horizontally extended top portion of the protruding portion.

According to another aspect of the present invention, a test probe arranged between a device to be tested and a test equipment to electrically connect a terminal of the device to be tested and a pad of the test equipment, includes a second conductive member including a first hole formed in an upper end, a second hole formed in a lower end, and a connection hole connecting between the first hole and the second hole, the first hole, the second hole, and the connection hole being arranged coaxially, a first conductive member fixedly inserted into the first hole of the second conductive member to be electrically connected to the second conductive member, including a probe portion that has a probe shape and is formed in an upper portion of the first conductive member by a micro-electromechanical systems (MEMS) process, and formed of a material having strength higher than the second conductive member, a pin member inserted into the second hole, a part of the pin member being arranged inside the second conducive member and the other part of the pin member protruding from the second hole of the second conducive member, to be vertically slidable in the second conducive member, and an elastic member arranged in the second conductive member to contact the pin member to elastically bias the pin member in a direction away from the first conductive member.

A catch portion protruding from an inner circumferential surface of the second conductive member may be formed in a lower end of the first hole to accommodate the first conductive member.

An inner diameter of the second conductive member formed by the catch portion may be smaller than an outer diameter of a lower end of the first conductive member.

The first conductive member may include an upper conductive portion having a probe portion formed in an upper end of the upper conductive portion, and a lower conductive portion arranged under the upper conductive portion and having a cross section larger than that of the upper conductive portion.

The second conductive member may include an insertion portion having a first hole formed inside, an intermediate portion having an outer diameter larger than that of the insertion portion and for inserting the elastic member, a lower portion in which the lower end is deformed inwardly, and an inclined portion connecting the insertion portion and the intermediate portion and having a diameter that increases toward a lower side of the inclined portion.

An upper end of the elastic member may contact the inclined portion.

According to another aspect of the present invention, a method of fabricating the test probe that is arranged between a device to be tested and a test equipment to electrically connect a terminal of the device to be tested and a pad of the test equipment, the test probe including a second conductive member including a first hole formed in an upper end, a second hole formed in a lower end, and a connection hole connecting between the first hole and the second hole, the first hole, the second hole, and the connection hole being arranged coaxially, a first conductive member fixedly inserted into the first hole of the second conductive member to be electrically connected to the second conductive member, including a probe portion that has a probe shape and is formed in an upper portion of the first conductive member by a micro-electromechanical systems (MEMS) process, and formed of a material having strength higher than the second conductive member, a pin member inserted into the second hole, a part of the pin member being arranged inside the second conducive member and the other part of the pin member protruding from the second hole of the second conducive member, to be vertically slidable in the second conducive member, and an elastic member arranged in the second conductive member to contact the pin member to elastically bias the pin member in a direction away from the first conductive member, includes a second conductive member forming operation in which a first hole, a second hole, and a connection hole are formed in a rod member, a plating operation in which an inner surface of the second conductive member is plated, a first conductive member fixing operation in which, while the first conductive member is inserted into the first hole, the second conductive member is caulked to allow the first conductive member to be fixed to the second conductive member, an insertion operation in which an elastic member is inserted into the second conductive member, and a second conductive member installation operation in which, after the pin member is inserted into the second hole, a lower end of the second conductive member is deformed inwardly to allow the pin member to be maintained in the second conductive member.

According to another aspect of the present invention, a method of fabricating the test probe that is arranged between a device to be tested and a test equipment to electrically connect a terminal of the device to be tested and a pad of the test equipment, the test probe including a second conductive member including a first hole formed in an upper end, a second hole formed in a lower end, and a connection hole connecting between the first hole and the second hole, the first hole, the second hole, and the connection hole being arranged coaxially, a first conductive member fixedly inserted into the first hole of the second conductive member to be electrically connected to the second conductive member, including a probe portion that has a probe shape and is formed in an upper portion of the first conductive member by a micro-electromechanical systems (MEMS) process, and formed of a material having strength higher than the second conductive member, a pin member inserted into the second hole, a part of the pin member being arranged inside the second conducive member and the other part of the pin member protruding from the second hole of the second conducive member, to be vertically slidable in the second conducive member, and an elastic member arranged in the second conductive member to contact the pin member to elastically bias the pin member in a direction away from the first conductive member, includes a second conductive member forming operation in which a first hole, a second hole, and a connection hole are formed in a pipe, a plating operation in which an inner surface of the second conductive member is plated, a first conductive member fixing operation in which, while the first conductive member is inserted into the first hole, the second conductive member is caulked to allow the first conductive member to be fixed to the second conductive member, an insertion operation in which an elastic member is inserted into the second conductive member, and a second conductive member installation operation in which, after the pin member is inserted into the second hole, a lower end of the second conductive member is deformed inwardly to allow the pin member to be maintained in the second conductive member.

Advantageous Effects of Invention since the first conductive member is fixedly coupled to the second conductive member in a simple manner of pressing and forming the second conductive member having the first conductive member inserted therein in the forming mold without a separate process such as soldering, the overall process is made easy.

BRIEF DESCRIPTION OF DRAWINGS

The above and other features and advantages of the present invention will become more apparent by describing in detail exemplary embodiments thereof with reference to the attached drawings in which.

MODE FOR THE INVENTION

Figure 1:
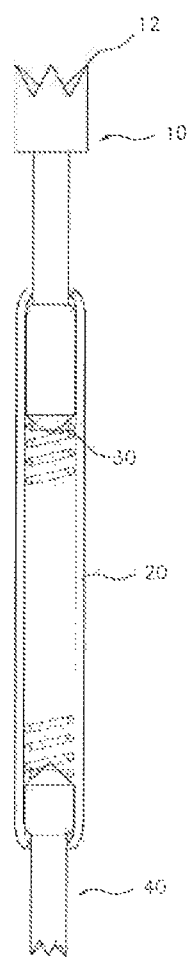
FIG. 1 is a cross-sectional view of a test probe according to a related art.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 3:
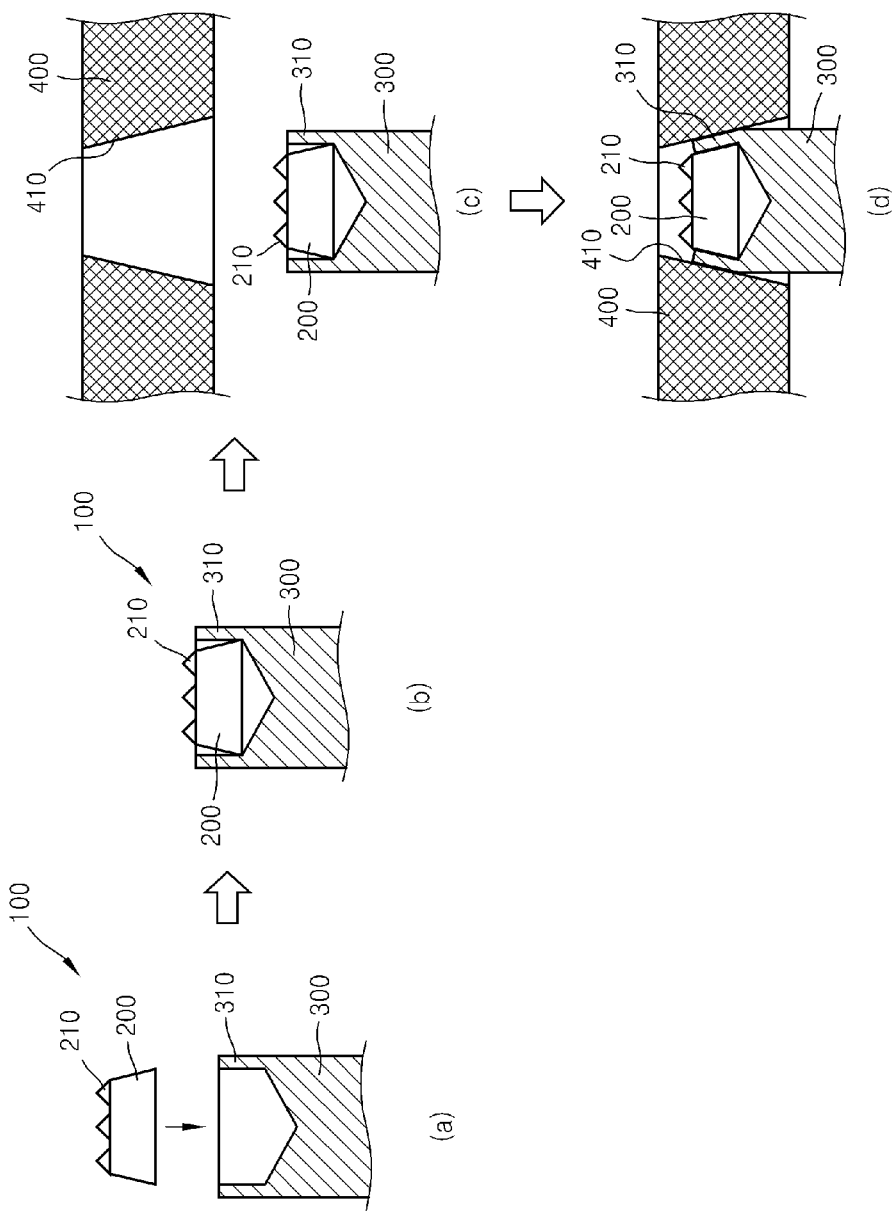

A test probe 100 according to the present invention includes a first conductive member 200 and a second conductive member 300, as illustrated in FIG. 3. In detail, the first conductive member 200 includes a probe portion 210 having a probe shape in an upper end thereof and is formed of a conductive metal material. In the first conductive member 200, the cross section of an upper portion is smaller than that of a lower portion. In detail, the first conductive member 200 may form a quadrangular pyramid shape.

Figure 2:
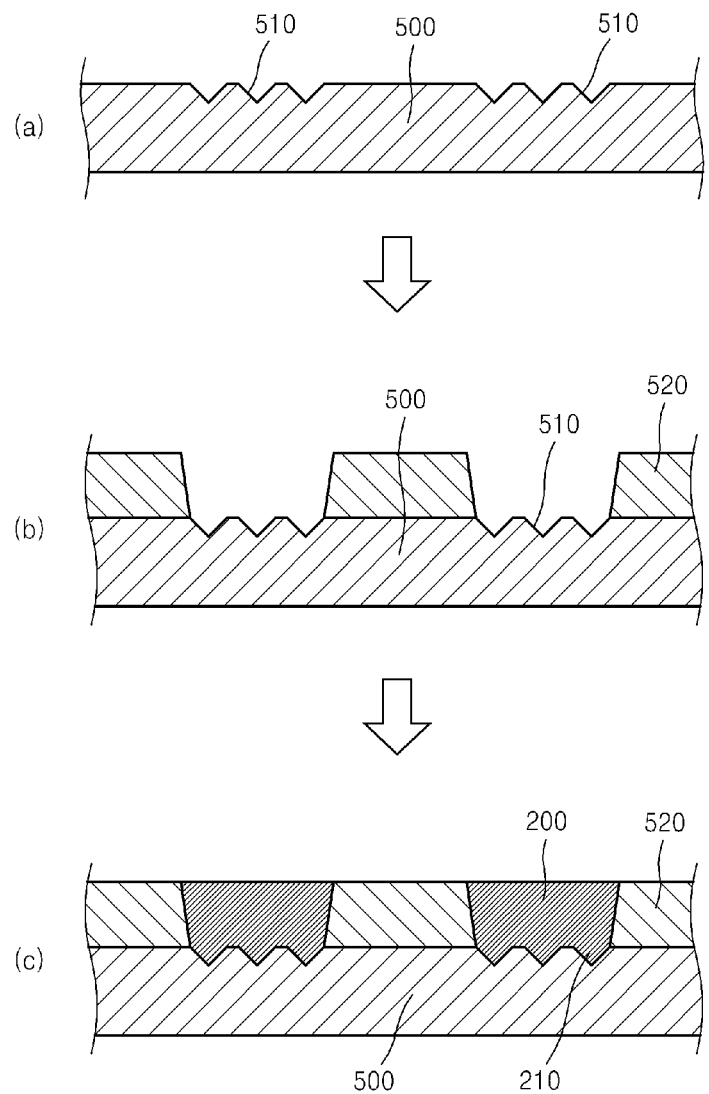
FIGS. 2A, 2B, and 2C illustrate a method of fabricating a first conductive member of a test probe according to an embodiment of the present invention.
FIGS. 3A, 3B, 3C, and 2D illustrate that the first conductive member of FIG. 2 is coupled to a second conductive member.

In the test probe 100 according to the present invention, the first conductive member 200 is fabricated as illustrated in FIGS. 2A, 2B, and 2C. The first conductive member 200 is fabricated by a micro-electromechanical systems (MEMS) process. In detail, after a groove 510 that corresponds to a tip (or a sharp portion at an end portion) of the probe portion 210 fabricated by wet etching is formed in a substrate 500, the substrate 500 is patterned using a dry film 520 or photoresist (PR). Then, the etched groove 510 is plated with a conductive material such as Ni—Co or Ni—W so that the first conductive member 200, where the probe portion 210 having a shape of a plurality of probes is formed, is completed. In the present embodiment, the dry film 520 is patterned multiple times to make the side surface of the first conductive member 200 inclined.

The second conductive member 300 is provided in which an insertion portion 310 having a concave groove shape and a cross section corresponding to the lower end of the first conductive member 200. The insertion portion 310 of the second conductive member 300 may be formed by a predetermined drilling process.

Thereafter, as illustrated in FIG. 3A, the first conductive member 200 is inserted into the insertion portion 310 of the second conductive member 300. In detail, the first conductive member 200 is inserted into the insertion portion 310 having a concave groove shape. After the insertion, the probe portion 210 is exposed to the outside as illustrated in FIG. 3B.

Then, as illustrated in FIG. 3C, a forming mold 400 for fixedly coupling the first conductive member 200 to the second conductive member 300 is prepared. A pressing groove 410 is vertically formed in the forming mold 400. The inner diameter of the pressing groove 410 in a lower end of the forming mold 400 is larger than the outer diameter of the insertion portion 310. From the lower end to the upper end of the pressing grove 410, the inner diameter of the pressing groove 410 decreases so as to be smaller than the outer diameter of the insertion portion 310.

Then, by deforming a part of the second conductive member 300 as illustrated in FIG. 3D, the first conductive member 200 is coupled to the second conductive member 300. In detail, the second conductive member 300 is pressed while the second conductive member 300 where the first conductive member 200 is accommodated in the insertion portion 310 is inserted into the pressing groove 410 of the forming mold 400. As such, when the second conductive member 300 is pressed by inserting the second conductive member 300 into the forming mold 400, the upper end of the insertion portion 310 contacts the inner surface of the pressing groove 410 and is deformed inwardly. At this time, the inner circumferential surface of the upper end of the insertion portion 310 of the second conductive member 300 closely contacts the outer circumferential surface of the upper end of the first conductive member 200 so that the first conductive member 200 is fixedly coupled to the second conductive member 300.

The test probe according to the present invention and the fabrication method thereof have merits as follows.

First, since the first conductive member 200 is fixedly coupled to the second conductive member 300 in a simple manner of pressing and forming the second conductive member 300 having the first conductive member 200 inserted therein in the forming mold 400 without a separate process such as soldering, the overall process is made easy.

Also, since the probability of the first conductive member 200 escaping from the second conductive member 300 is low compared to a soldering method, stable fixing coupling may be possible.

Also, since the first conductive member 200 is fabricated by the MEMS process, a fine probe shape may be fabricated as desired.

The test probe according to the present invention may be deformed as follows.

Figure 4:
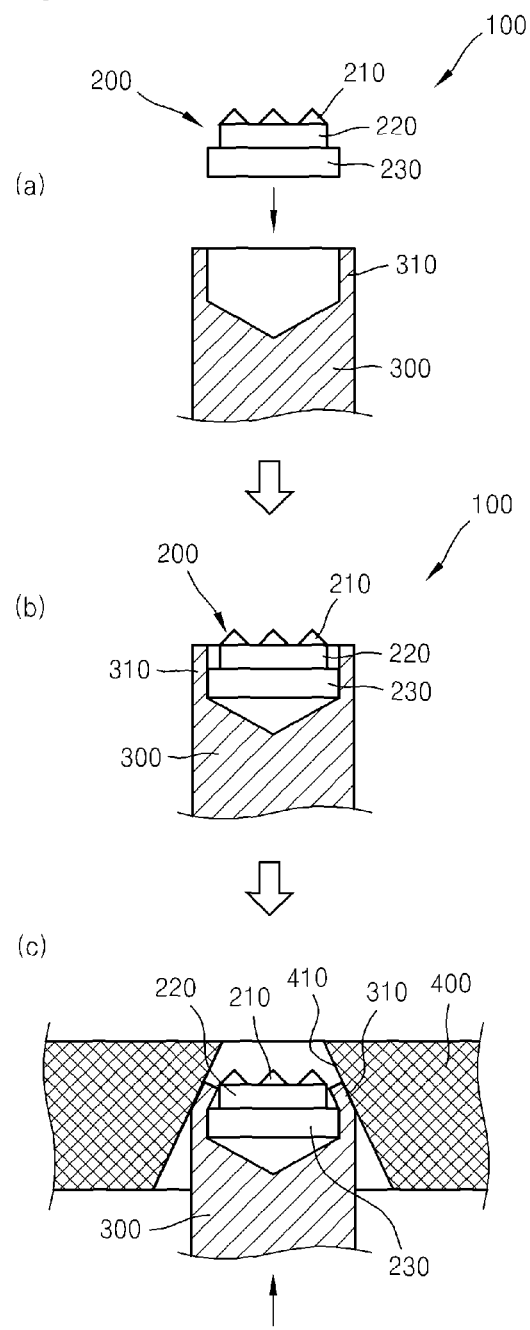
FIGS. 4A, 4B, and 4C illustrate a method of fabricating a test probe according to another embodiment of the present invention.

First, as illustrated in FIGS. 4A, 4B, and 4C, the first conductive member 200 includes an upper conductive portion 220 having a circular plate and where the probe portion 210 in a probe shape is provided on an upper surface thereof, and a lower conductive portion 230 integrally formed at a lower side of the upper conductive portion 220 and having a circular plate shape of a diameter larger than that of the upper conductive portion 220. However, the present invention is not limited thereto and the upper conductive portion 220 and the lower conductive portion 230 may have a rectangular plate shape.

Also, the second conductive member 300 may include the insertion portion 310 having a circular groove having an inner diameter corresponding to an outer diameter of the lower conductive portion 230.

In the test probe 100 configured as above, the first conductive member 200 is inserted into the insertion portion 310 of the second conductive member 300 and the upper end of the second conductive member 300 is deformed inwardly so that the inner circumferential surface of the upper end of the insertion portion 310 closely contacts the outer circumferential surface of the upper conductive portion 220 of the first conductive member 200. Accordingly, the first conductive member 200 and the second conductive member 300 are closely coupled to each other.

The test probe 100 according to the present embodiment is fabricated as follows.

First, the first conductive member 200 is provided by a method similar to the method of FIGS. 2A, 2B, and 2C. The probe portion 210 may be fabricated by the MEMS process. As illustrated in FIG. 4A, the second conductive member 300 and the first conductive member 200 are aligned with each other, and then, as illustrated in FIG. 4B, the first conductive member 200 is inserted into the insertion portion 310 of the second conductive member 300. The probe portion 210 of the first conductive member 200 may protrude outwardly from the insertion portion 310 of the second conductive member 300. Then, the forming mold 400 is provided, and the second conducive member 300 in which the first conductive member 200 is inserted is inserted into the pressing groove 410 of the forming mold 400 to contact an inner surface of the pressing groove 410. That is, as illustrated in FIG. 4C, by inserting the second conductive member 300 into the pressing groove 410 and pressing the second conductive member 300 against the inner surface of the pressing groove 410, the insertion portion 310 of the second conducive member 300 is caulking deformed such that the inner circumferential surface of the insertion portion 310 of second conducive member 300 can closely contact the upper conductive portion 220 of the first conductive member 200. Accordingly, as the inner circumferential surface of the insertion portion 310 closely contacts the outer circumferential surface of the upper conductive portion 220 of the first conductive member 200, the first conductive member 200 may be fixedly coupled to the second conducive member 300.

Figure 5:
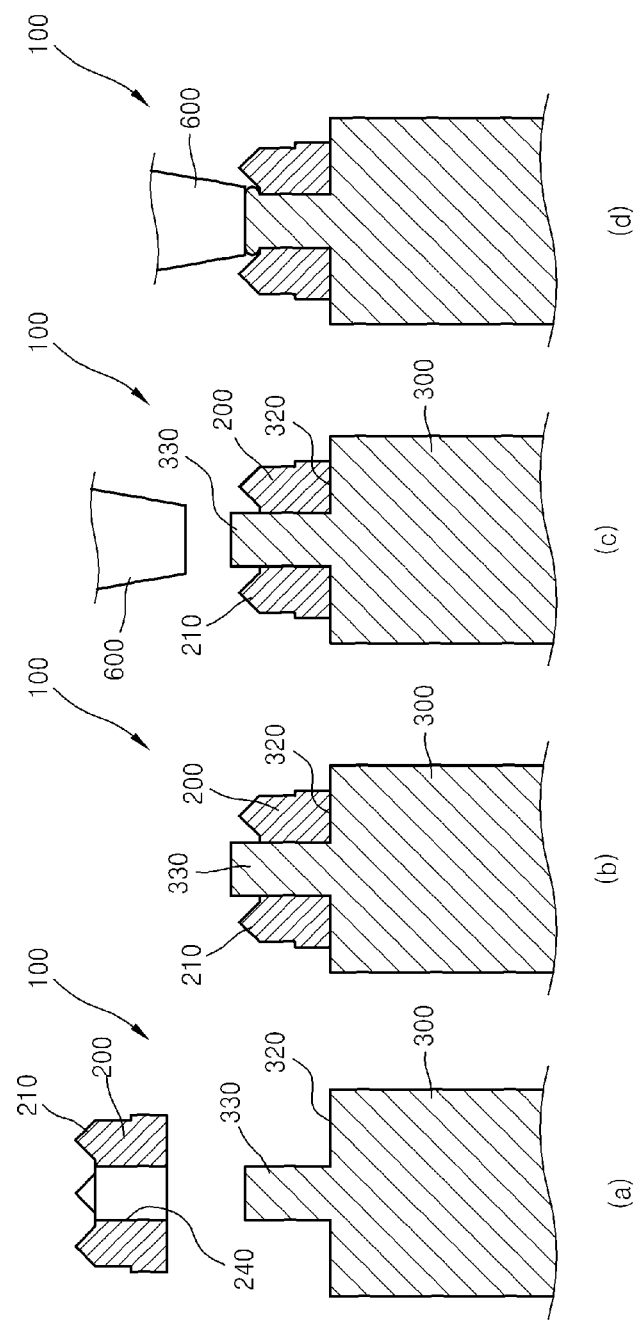
FIGS. 5A, 5B, 5C, and 5D illustrate a method of fabricating a test probe according to another embodiment of the present invention.

FIGS. 5A, 5B, 5C, and 5D illustrate a method of fabricating the test probe 100 according to another embodiment of the present invention. Referring to FIGS. 5A, 5B, and 5C, the test probe 100 includes the first conductive member 200 and the second conducive member 300. The probe portion 210 having a probe shape and formed by the MEMS process is provided at the top of the first conductive member 200. The first conductive member 200 is formed of a conductive metal material in a ring shape and has a connection hole 240 is vertically formed in the middle thereof.

The second conducive member 300 includes an accommodation surface 320 on which a lower surface of the first conductive member 200 is placed, and a protruding portion 330 protruding from the accommodation surface 320 higher than the first conductive member 200 and having a shape corresponding to the connection hole 240. The top portion of the protruding portion 330 is pressed to be horizontally extended so that an upper surface of the first conductive member 200 is restricted and fixed by a lower surface of the horizontally extended top portion of the protruding portion 330.

In the method of fabricating the test probe 100 according to the present embodiment, as illustrated in FIG. 5A, the first conductive member 200 having a ring shape and the second conducive member 300 having the protruding portion 330 having a shape corresponding to that of the connection hole 240 of the first conductive member 200 are aligned to each other.

Then, as illustrated in FIG. 5B, the first conductive member 200 and the second conducive member 300 are coupled to each other such that the protruding portion 330 having a ring shape can be inserted into the connection hole 240 of the first conductive member 200. As illustrated in FIGS. 5C and 5D, the protruding portion 330 is deformed using a predetermined punch 600 so that the protruding portion 330 closely contacts the top surface of the first conductive member 200. As a result, the first conductive member 200 is fixedly coupled to the second conducive member 300.

Figure 6:
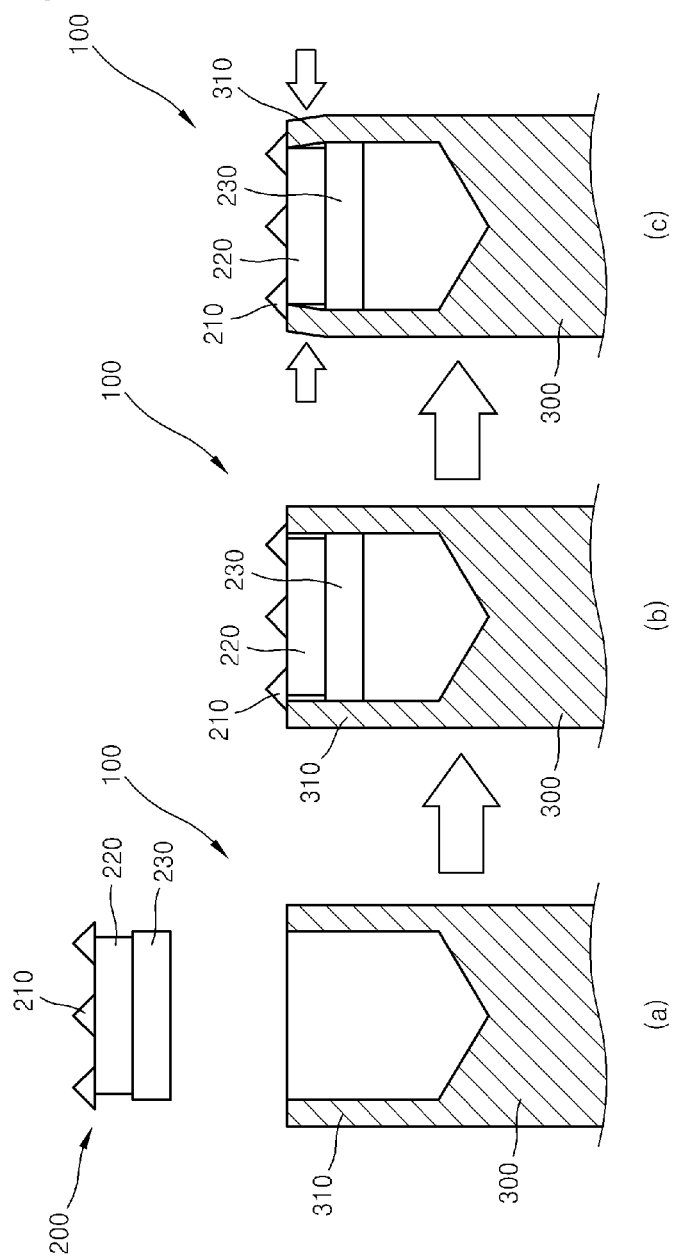
FIGS. 6A, 6B, and 6C illustrate a method of fabricating a test probe according to another embodiment of the present invention.

FIGS. 6A, 6B, and 6C illustrate a method of fabricating the test probe 100 according to another embodiment of the present invention. Referring to FIGS. 6A, 6B, and 6C, although it is similar to the test probe 100 of FIGS. 4A, 4B, and 4C, a part of the probe portion 210 protrudes outside the upper conductive portion 220. The probe portion 210 may have a size large enough to be accommodated on the upper end of the insertion portion 310 when the first conductive member 200 is accommodated in the insertion portion 310 of the second conducive member 300.

As such, when the probe portion 210 protrudes horizontally longer than the upper connective portion 220, even when the depth of the insertion portion 310 formed in the second conducive member 300 is deep, the probe portion 210 is prevented from being berried in the insertion portion 310 and exposed to the outside as the probe portion 210 is placed on an upper surface of the insertion portion 310 of the second conducive member 300. In the above-described method of fabricating the test probe 100, although in FIG. 4 the insertion portion 310 is caulking deformed by being inserted into the forming mold 400 and pressed, the present invention is not limited thereto. The insertion portion 310 may be caulking deformed by horizontally pressing the insertion portion 310 using a separate tool.

The test probe 100 according to the present embodiment is inserted into a test socket housing (not shown). A single test probe or a plurality of test probes may be provided. The test socket housing is arranged between the device to be tested and the test equipment. While an upper end of the test probe 100 contacts a terminal (not shown) of the device to be tested, a lower end of the test probe 100 contacts a pad (not shown) of the test equipment.

Figure 7:
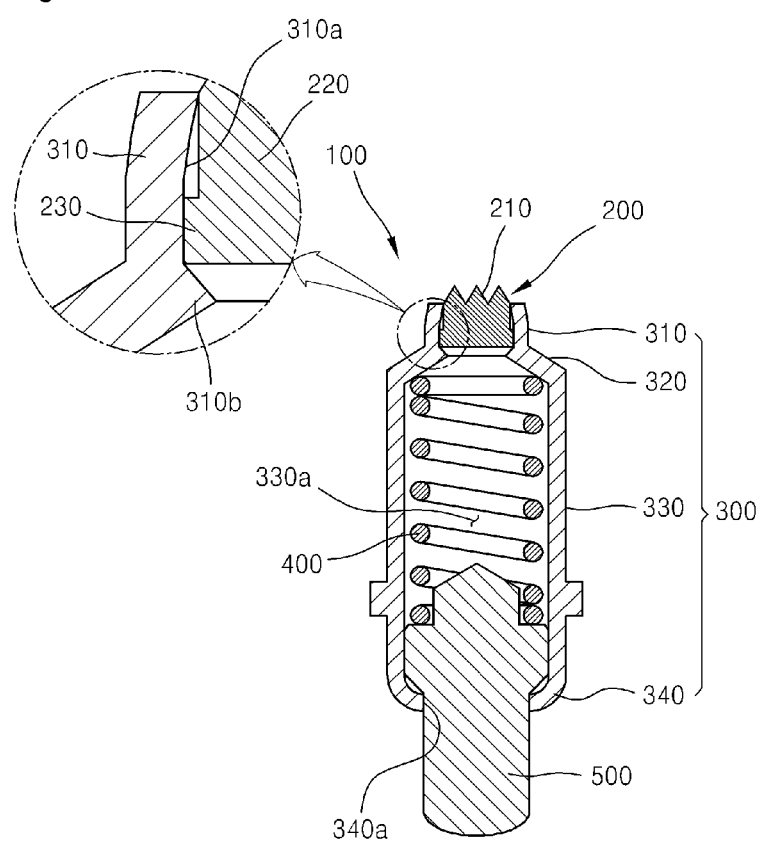
FIG. 7 illustrates a test probe according to another embodiment of the present invention.
Figure 8:
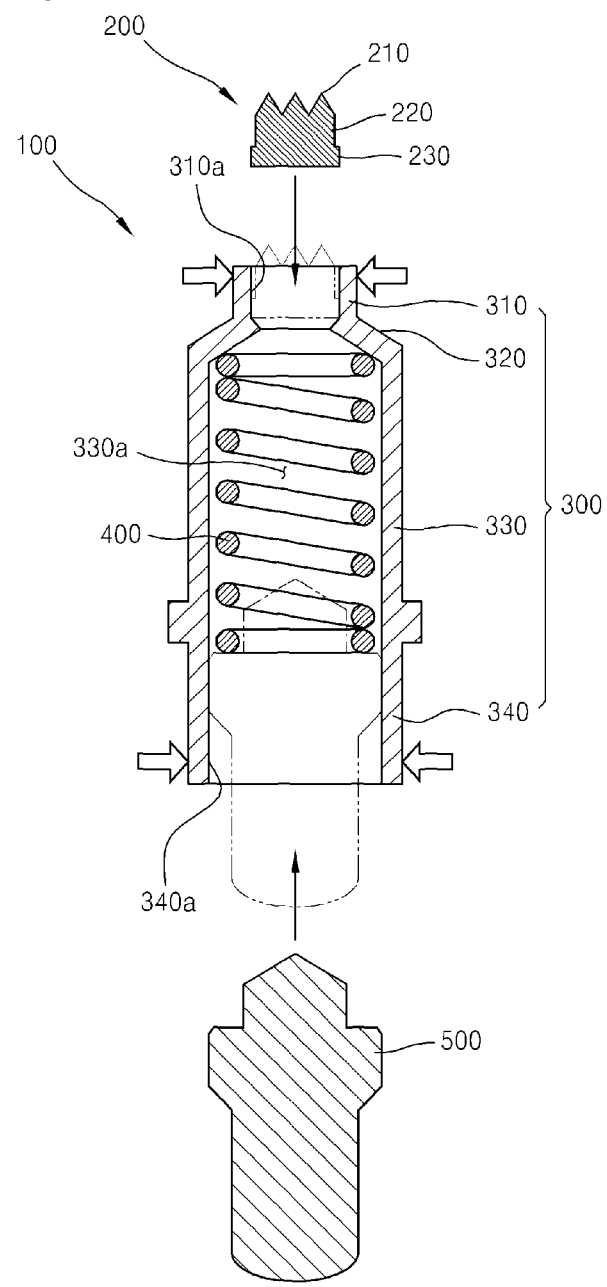
FIG. 8 schematically illustrates fabrication of the test probe of FIGS. 7.

The test probe 100 may include the first conductive member 200, the second conducive member 300, an elastic member 400, and a pin member 500, as illustrated in FIGS. 7 and 8. The first conductive member 200 is inserted into a first hole 310a of the second conducive member 300 to be fixedly coupled thereto and is electrically connected to first conductive member 200. The probe portion 210 is formed at the top end of the first conductive member 200. The first conductive member 200 may be formed of a material that is stronger than the second conducive member 300.

The first conductive member 200 may be fabricated in a variety of methods and also by the MEMS process. The first conductive member 200 fabricated by the MEMS process may be processed precisely, while having a sharp tip end, compared to the first conductive member 200 that is formed by a mechanical cutting process. Also, the first conductive member 200 may be easily fabricated to be compact and a plurality of probe portions 210 may be easily fabricated.

The upper conductive portion 220 where the probe portion 210 is formed is formed in an upper portion of the first conductive member 200, whereas the lower conductive portion 230 protruding outwardly and having a diameter larger than that of the upper conductive portion 220 is formed in a lower portion to the first conductive member 200. The lower conductive portion 230 may have an outer diameter so large as to be press-fit to the first hole 310a of the second conducive member 300 to closely contact an inner circumferential surface of the second conducive member 300. Also, a predetermined separation space is formed between the upper conductive portion 220 and the insertion portion 310 so that the second conducive member 300 may be firmly coupled to the first conductive member 200 by caulking.

The second conducive member 300 may have a cylindrical shape as a whole and include the insertion portion 310 having the first hole 310a formed therein, an intermediate portion 330 for inserting an elastic member 400 and having an outer diameter larger than that of the insertion portion 310, a lower portion 340 integrally connected to the intermediate portion 330 and deformed inwardly, and an inclined portion 320 connecting between the insertion portion 310 and the intermediate portion 330 and having a diameter that increases toward a lower portion thereof.

While a connection hole 330a is formed in the intermediate portion 330, a second hole 340a is formed in the lower portion 340. The connection hole 330a connects between the first hole 310a and the second hole 340a. The first hole 310a, the second hole 340a, and the connection hole 330a are arranged coaxially. A plate layer exhibiting a superior electrical conductivity, such as, gold, nickel, or silver, may be formed inside the second conducive member 300.

A catch portion 310b protruding from the inner circumferential surface of the second conducive member 300 is provided in the insertion portion 310 so that the first conductive member 200 may be accommodated in a lower portion of the insertion portion 310. The inner diameter of the second conducive member 300 formed by the catch portion 310b may be the same as or slightly less than the outer diameter of the lower conductive portion 230. Accordingly, the first conductive member 200 may be certainly accommodated in the insertion portion 310 of the second conducive member 300.

The upper end of the insertion portion 310 is deformed inwardly toward the second conducive member 300, which is done by a caulking process. That is, in a state of the first conductive member 200 being inserted into the second conducive member 300, the upper end of the second conducive member 300 is deformed inwardly by the caulking process so that the first conductive member 200 may be certainly fixedly coupled to the second conducive member 300. The second conducive member 300 may be formed of any material exhibiting a superior electrical conductivity, particularly a material exhibiting high strength, such as, Be—Cu.

The elastic member 400 is arranged inside the second conducive member 300 and contacts the pin member 500 to elastically bias the pin member 500 in a direction away from the first conductive member 200. Any member capable of being compressed and expanded, for example, a compression coil spring, may be used for the elastic member 400. The compressing coil spring may be formed of a metal material exhibiting a superior conductivity because the compression coil spring needs to be conductive when necessary.

The pin member 500 is inserted into the second hole 340a such that a part of the pin member 500 is arranged inside the second conducive member 300 and the other part thereof protrudes from the second hole 340a of the second conducive member 300 so as to be vertically slidable in the second conducive member 300. Since the pin member 500 configured as above is similar to one used in a related art, a detailed description thereof will be omitted herein.

Figure 9:
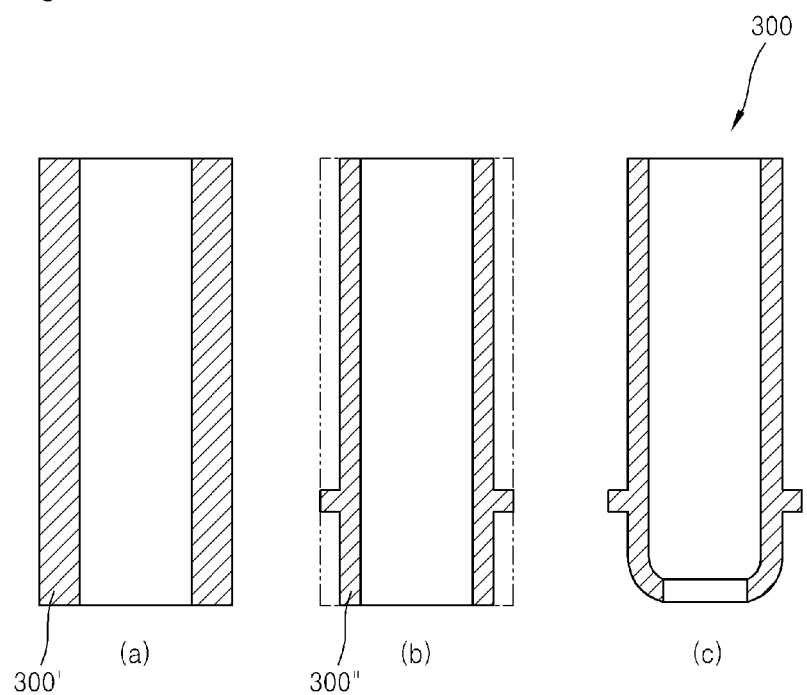
FIGS. 9A, 9B, and 9C illustrate a method of fabricating a test probe according to another embodiment of the present invention.

The test probe 100 according to the present invention may be fabricated as follows. As illustrated in FIG. 9, the first hole 310a, the second hole 340a, and the connection hole 330a are formed in a rod member. In detail, the first hole 310a, the second hole 340a, and the connection hole 330a are formed in the rod member by a drilling process. (Second conductive member forming operation)

Then, the inner surface of the second conducive member 300 is plated. In detail, the second conducive member 300 is dipped into a plate solution so as to be electrically or chemically plated. The plate solution circulates through the first hole 310a, the connection hole 330a, and the second hole 340a so that the inside of the second conducive member 300 may be certainly plated. (Plating operation)

While the first conductive member 200 is inserted into the first hole 310a, the second conducive member 300 is caulked so that the first conductive member 200 may be fixed to the second conducive member 300. (First conductive member fixing operation)

The elastic member 400 is inserted into the inside of the second conducive member 300. In detail, the compression coil spring is inserted into the inside of the second conducive member 300. (Insertion operation)

After the pin member 500 is inserted into the second hole 340a, the lower end of the second conducive member 300 is deformed inwardly so that the pin member 500 may be accommodated and maintained in the second conducive member 300. (Second conductive member installation operation)

The test probe 100 according to the present invention may be fabricated as follows. Although in the above-described fabrication method the first hole 310a, the second hole 340a, and the connection hole 330a are formed in the second conducive member 300 by a drilling process, the present invention is not limited thereto. Referring to FIGS. 9A, 9B, and 9C, a pipe 300" is fabricated by processing an outer circumferential surface of a pipe 300' in which a hole is already formed. Then, a lower end of the pipe 300" is deformed inwardly to form the second conducive member 300. In detail, the first hole 310a, the second hole 340a, and the connection hole 330a are formed in the pipe 300'. (Second conductive member forming operation)

The inner surface of the second conducive member 300 is plated. In detail, while the second conducive member 300 is dipped in a plate solution, the second conducive member 300 is electrically or chemically plated. The plating solution circulates through the first hole 310a, the connection hole 330a, and the second hole 340a so that the inside of the second conducive member 300 is certainly plated. (Plating operation)

While the first conductive member 200 is inserted into the first hole 310a, the second conducive member 300 is caulked so that the first conductive member 200 may be fixed to the second conducive member 300. (First conductive member fixing operation)

The elastic member 400 is inserted into the inside of the second conducive member 300. In detail, the compression coil spring is inserted into the inside of the second conducive member 300. (Insertion operation)

After the pin member 500 is inserted into the second hole 340a, the lower end of the second conducive member 300 is deformed inwardly so that the pin member 500 may be accommodated in the second conducive member 300. (Second conductive member installation operation)

The test probe 100 according to the present invention is operated as follows. First, the test probe 100 inserted in the test socket housing is mounted on the test equipment. The pad of the test equipment and the pin member 500 of the test probe 100 maintain a contact state with each other. Then, the device to be tested descends and the terminal of the device to be tested contacts a surface of the first conductive member 200 of the test probe 100. As the device to be tested descends, the elastic member 400 of the test probe 100 is compressed. Accordingly, the pin member 500 and the first conductive member 200 may certainly and closely contact the terminal and the pad, respectively.

The test probe 100 according to the present invention has the following effects. First, since a single pin member sliding in the second conducive member is provided, deterioration in a contact force may be prevented at its maximum.

Also, since the first conductive member is fixedly provided to the second conductive member and the first and second conductive members certainly closely contact each other, foreign materials are not likely to be introduced into the second conductive member. Also, since the position of the first conductive member is certainly maintained, the first conductive member and the terminal of the device to be tested may be easily contacted each other.

Also, since a separate through hole is not provided in a lateral surface of the second conductive member and a first hole and a second hole are formed in both ends of the second conductive member, not only the plating solution smoothly circulates but also processing is made easy.

Also, since the first conductive member having strength higher than the second conductive member is used, the first and second conductive members are not easily abraded in spite of frequent contacts with the terminal and a test may be performed for a long time.

Although in the above description the test probe and the fabrication method thereof are described, the present invention is not limited thereto and a variety of modifications are possible.

As described above, in the test probe according to the present invention, since the first conductive member where a fine probe portion is formed is fixedly coupled to the second conductive member in a pressing and deforming fixing manner, the overall assembly process may be simplified and a coupling portion may be relatively firm.

Also, in the test probe according to the present invention, since the probe portion is fabricated by a MEMS technology, even when a material having relatively higher strength is used, fabrication thereof is possible so that durability of the overall test probe may be enhanced.

Also, in the test probe according to the present invention, since only a portion where the probe portion is formed is separately installed or detached, when the probe portion is abraded, only a related portion needs to be replaced.

While this invention has been particularly shown and described with reference to exemplary embodiments thereof, it will be understood by those skilled in the art that various changes in form and details may be made therein without departing from the spirit and scope of the invention as defined by the appended claims.

The invention claimed is:

1. A method of fabricating a test probe, the method comprising:
    providing a first conductive member formed of a conductive metal material, the first conductive member comprising a probe portion that has a probe shape and is formed in an upper portion of the first conductive member by a micro-electromechanical systems (MEMS) process;
    providing a second conductive member formed of a conductive metal material, the second conductive member having an insertion portion formed in an upper portion of the second conductive member for inserting the first conductive member to be coupled to the insertion portion;
    inserting the first conductive member into the insertion portion of the second conductive member; and
    fixedly coupling the first conductive member to the second conductive member by deforming a part of the second conductive member,
    wherein the first conductive member comprises an upper conductive portion having a circular plate shape and having the probe portion on an upper end surface, and a lower conductive portion integrally formed at a lower side of the upper conductive portion and having a circular plate shape, the lower conductive portion having a diameter greater than that of the upper conductive portion.

2. The method of claim 1, wherein
    the insertion portion of the second conductive member is a groove having a circular cross-section having an inner diameter corresponding to the lower conductive portion, and
    in the fixedly coupling the first conductive member to the second conductive member, the method further comprises pressing an outer circumferential surface of the insertion portion corresponding to the upper conductive member toward the upper conductive portion, and an outer circumferential surface of the upper conductive portion and an inner circumferential surface of the insertion portion contact each other to allow the first conductive member to be fixedly coupled to the second conductive member.

3. The method of claim 2, wherein the probe portion protrudes outside the upper conductive portion, and the probe portion has a size large enough to be accommodated on an upper end of the insertion portion when the first conductive member is accommodated in the insertion portion of the second conductive member.

4. The method of claim 2, further comprising:
    providing a forming mold in which a pressing groove is formed, an inner diameter of a lower end of the pressing groove being larger than an outer diameter of the insertion portion and gradually decreasing toward an upper end of the pressing groove to be smaller than the outer diameter of the insertion portion,
    wherein in the fixedly coupling the first conductive member to the second conductive member, the method further comprises inserting the second conductive member into the pressing groove, and the insertion portion is caulking deformed inwardly by the inner surface of the pressing groove.

5. The method of claim 1, wherein in the inserting the first conductive member into the insertion portion of the second conductive member, the first conductive member is press-fit to the second conductive member.

6. A test probe fabricated by the method of claim 1.

7. A method of fabricating a test probe, the method comprising:
    providing a first conductive member formed of a conductive metal material, the first conductive member having a ring shape and having a connection hole vertically formed at a center of the first conductive member,
    providing a second conductive member formed of a conductive metal material, the second conductive member comprises an accommodation surface on which a lower surface of the first conductive member is accommodated, and a protruding portion protruding from the accommodation surface, having a shape corresponding to the connection hole, and protruding upwardly higher than the first conductive member,
    inserting the protruding portion of the second conductive member into the connection hole of the first conductive member; and
    fixedly coupling the first conductive member to the second conductive member by deforming the protruding portion by applying pressure to the protruding portion using a punch, and the protruding portion contacts an upper end surface of the first conductive member to the second conductive member.

8. A test probe comprising:
    a first conductive member formed of a conductive metal material and comprising an upper conductive portion having a circular plate shape and having a probe portion on an upper end surface, and a lower conductive portion integrally formed at a lower side of the upper conductive portion and having a circular plate shape, the lower conductive portion having a diameter greater than that of the upper conductive portion; and
    a second conductive member having an insertion portion for inserting the first conductive member to be coupled to the insertion portion,
    wherein the insertion portion of the second conductive member has a concave groove shape having an inner diameter corresponding to a lower end of the first conductive member, and an upper end of the insertion portion is deformed inwardly to allow an inner circumferential surface of an upper end of the insertion portion to contact an outer circumferential surface of the first conductive member.

9. A test probe comprising:
a first conductive member formed of a conductive metal material and comprising an upper conductive portion having a circular plate shape and having a probe portion on an upper end surface, and a lower conductive portion integrally formed at a lower side of the upper conductive portion and having a circular plate shape, the lower conductive portion having a diameter greater than that of the upper conductive portion; and
a second conductive member having an insertion portion formed in an upper portion of the second conductive member, the insertion portion having a groove shape having a circular cross section and having an inner diameter corresponding to the lower conductive portion to allow the first conductive member to be inserted in and coupled to the insertion portion, and
the first conductive member is inserted into the insertion portion, and an upper end of the insertion portion is deformed inwardly to allow an inner circumferential surface of an upper end of the insertion portion to contact an outer circumferential surface of the first conductive member.

10. The test probe of claim 9, wherein the probe portion protrudes outside the upper conductive portion and has a size large enough to be accommodated on an upper end of the insertion portion when the first conductive member is accommodated in the insertion portion of the second conductive member.

11. A test probe arranged between a device to be tested and a test equipment to electrically connect a terminal of the device to be tested and a pad of the test equipment, the test probe comprising:
a second conductive member comprising a first hole formed in an upper end, a second hole formed in a lower end, and a connection hole connecting between the first hole and the second hole, the first hole, the second hole, and the connection hole being arranged coaxially;
a first conductive member fixedly inserted into the first hole of the second conductive member to be electrically connected to the second conductive member, comprising a probe portion that has a probe shape and is formed in an upper portion of the first conductive member by a micro-electromechanical systems (MEMS) process, and formed of a material having strength higher than the second conductive member;
a pin member inserted into the second hole, a part of the pin member being arranged inside the second conductive member and the other part of the pin member protruding from the second hole of the second conductive member, to be vertically slidabie in the second conductive member; and
an elastic member arranged in the second conductive member to contact the pin member to elastically bias the pin member in a direction away from the first conductive member,
wherein a catch portion protruding from an inner circumferential surface of the second conductive member is formed in a lower end of the first hole to accommodate the first conductive member.

12. The test probe of claim 11, wherein an inner diameter of the second conductive member formed by the catch portion is smaller than an outer diameter of a lower end of the first conductive member.

13. The test probe of claim 11, wherein the first conductive member comprises an upper conductive portion having a probe portion formed in an upper end of the upper conductive portion, and a lower conductive portion arranged under the upper conductive portion and having a cross section larger than that of the upper conductive portion.

14. The test probe of claim 11, wherein the second conductive member comprises:
an insertion portion having a first hole formed inside;
an intermediate portion having an outer diameter larger than that of the insertion portion and for inserting the elastic member;
a lower portion in which the lower end is deformed inwardly; and
an inclined portion connecting the insertion portion and the intermediate portion and having a diameter that increases toward a lower side of the inclined portion.

15. The test probe of claim 14, wherein an upper end of the elastic member contacts the inclined portion.

16. A method of fabricating the test probe of claim 11, the method comprising:
forming a second conductive member in which a first hole, a second hole, and a connection hole are formed in a rod member;
plating an inner surface of the second conductive member;
fixing a first conductive member, while the first conductive member is inserted into the first hole, and the second conductive member is caulked to allow the first conductive member to be fixed to the second conductive member;
inserting an elastic member into the second conductive member; and
installing a second conductive member, after the pin member is inserted into the second hole, and a lower end of the second conductive member is deformed inwardly to allow the pin member to be maintained in the second conductive member.

17. A method of fabricating the test probe of claim 11, the method comprising:
forming a second conductive member in which a first hole, a second hole, and a connection hole are formed in a pipe;
plating an inner surface of the second conductive member;
fixing a first conductive member, while the first conductive member is inserted into the first hole, and the second conductive member is caulked to allow the first conductive member to be fixed to the second conductive member;
inserting an elastic member into the second conductive member; and
installing a second conductive member, after the pin member is inserted into the second hole, and a lower end of the second conductive member is deformed inwardly to allow the pin member to be maintained in the second conductive member.

* * * * *